United States Patent
Dang et al.

(10) Patent No.: US 7,382,148 B2
(45) Date of Patent: Jun. 3, 2008

(54) SYSTEM AND METHOD FOR TESTING AN LED AND A CONNECTOR THEREOF

(75) Inventors: De-Hua Dang, Guangdong (CN); Yi-Ching Weng, Guangdong (CN); Ze-Jun Chen, Guangdong (CN)

(73) Assignees: Hong Fu Jin Precision Industry (Shen Zhen) Co., Ltd., Shenzhen, Guangdong Province, P.R.C.; Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 105 days.

(21) Appl. No.: 11/308,609

(22) Filed: Apr. 12, 2006

(65) Prior Publication Data

US 2006/0267626 A1    Nov. 30, 2006

(30) Foreign Application Priority Data

Apr. 21, 2005   (CN) .................... 2005 1 0034348

(51) Int. Cl.
*G01R 31/26* (2006.01)

(52) U.S. Cl. ..................... 324/767; 714/733

(58) Field of Classification Search ........... 324/767, 324/770, 73.1, 537, 764, 765; 714/735, 736
See application file for complete search history.

(56) References Cited

U.S. PATENT DOCUMENTS

| | | | | |
|---|---|---|---|---|
| 4,611,116 A | * | 9/1986 | Batt | 250/239 |
| 4,755,874 A | * | 7/1988 | Esrig et al. | 348/126 |
| 4,808,815 A | * | 2/1989 | Langley | 250/227.28 |
| 5,444,390 A | * | 8/1995 | Bartlett et al. | 324/770 |
| 6,028,441 A | * | 2/2000 | Alvord et al. | 324/767 |
| 6,087,846 A | * | 7/2000 | Alvord et al. | 324/767 |
| 6,490,037 B1 | * | 12/2002 | Schmitt | 356/416 |

\* cited by examiner

*Primary Examiner*—Ha Tran Nguyen
*Assistant Examiner*—Arleen M. Vazquez
(74) *Attorney, Agent, or Firm*—Winston Hsu

(57) ABSTRACT

A system for testing a light emitting diode (LED) (20) and connectors thereof. The system includes: a chip (10) having general purpose input output (GPIO) function and a plurality of pins (101), a test fixture (30), a parallel interface (40), and a programmable device (50). The programmable device includes a setting module (501), a pin initializing module (502), a potential controlling module (503), a data capturing module (504), and a comparing module (505). A related method is also provided.

5 Claims, 3 Drawing Sheets

SYSTEM AND METHOD FOR TESTING AN LED AND A CONNECTOR THEREOF

FIELD OF THE INVENTION

The present invention relates to a system and method for testing a light emitting diode (LED) and a connector thereof.

DESCRIPTION OF RELATED ART

Usually, there is a light emitting diode (LED) and a connector thereof installed on a computer's motherboard in order to show whether the computer is powered on successfully. The LED needs voltage difference to light up. But if the LED and the connector thereof are broken, it cannot show whether the computer has powered on successfully. For testing the LED and the connector, there is a conventional method using a circuit board to connect the LED and the connector, afterwards, a user controls potentials of the circuit board to generate voltage difference for observing whether the LED can is in good working condition.

However, testing the LED and the connector just by the user completely is inefficient and amiss.

Therefore, what is needed is a system and method for testing an LED and connector thereof, by which the user can test the LED and the connector efficiently.

SUMMARY OF INVENTION

A system for testing a light emitting diode (LED) and a connector thereof in accordance with a preferred embodiment of the present invention includes: a chip having general purpose input output (GPIO) function for outputting potentials to the LED via a plurality of pins; a parallel interface connected with the LED through a test fixture for receiving data output from the test fixture after the chip outputs the potentials to the LED; and a programmable device connected to the chip and the parallel interface. The programmable device includes: a setting module for predefining ideal data before the chip outputs the potentials to the LED; a pin initializing module for initializing the pins of the chip to a potential output mode; a potential controlling module for controlling the chip to output different potentials to the LED; a data capturing module for capturing data from the test fixture to the parallel interface; and a comparing module for comparing the captured data with the ideal data, and judging whether the two data are equal, in order to determine whether the LED and the connector thereof are eligible.

Furthermore, a preferred method for testing a light emitting diode (LED) and a connector thereof is provided. The method includes the steps of: predefining ideal data before a chip having general purpose input output (GPIO) function connected with the LED outputs potentials to the LED; initializing pins of the chip to a potential output mode; controlling the chip to output different potentials to the LED; capturing data output from a test fixture to a parallel interface after the chip outputs the potentials to the LED; comparing the captured data with the ideal data and judging whether the two data are equal; and determining the LED and the connector as being eligible if the two data are equal.

Other advantages and novel features of the embodiments will be drawn from the following detailed description with reference to the attached drawings.

DETAILED DESCRIPTION

Figure 1:
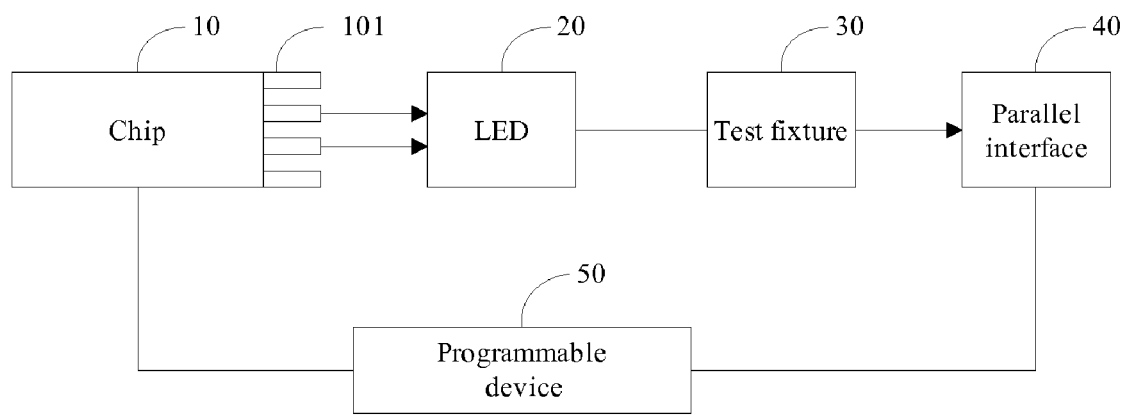
FIG. 1 is a schematic diagram of hardware configuration of a system for testing a light emitting diode (LED) and a connector thereof in accordance with a preferred embodiment.

FIG. 1 is a schematic diagram of hardware configuration of a system for testing a light emitting diode (LED) and a connector thereof (hereinafter, "the system") in accordance with a preferred embodiment. The system includes a chip 10 having general purpose input output (GPIO) function and a plurality of pins 101, an LED 20 having a connector thereof, a test fixture 30, a parallel interface 40, and a programmable device 50. The chip 10, which may be a south bridge chipset or a super I/O (input/output) installed in a motherboard of a computer (not shown) is used for outputting potentials to the LED 20 via the pins 101. The test fixture 30 is connected with the LED 20, and is used for receiving data output from the LED 20 after the chip outputs the potentials to the LED 20. The parallel interface 40 is connected with the LED 20 through the test fixture 30, and is used for receiving the data output from the test fixture 30. The programmable device 50, which is connected to the chip 10 and the parallel interface 40, has software installed therein and may be a hard disk of the computer or any other suitable device.

Figure 2:
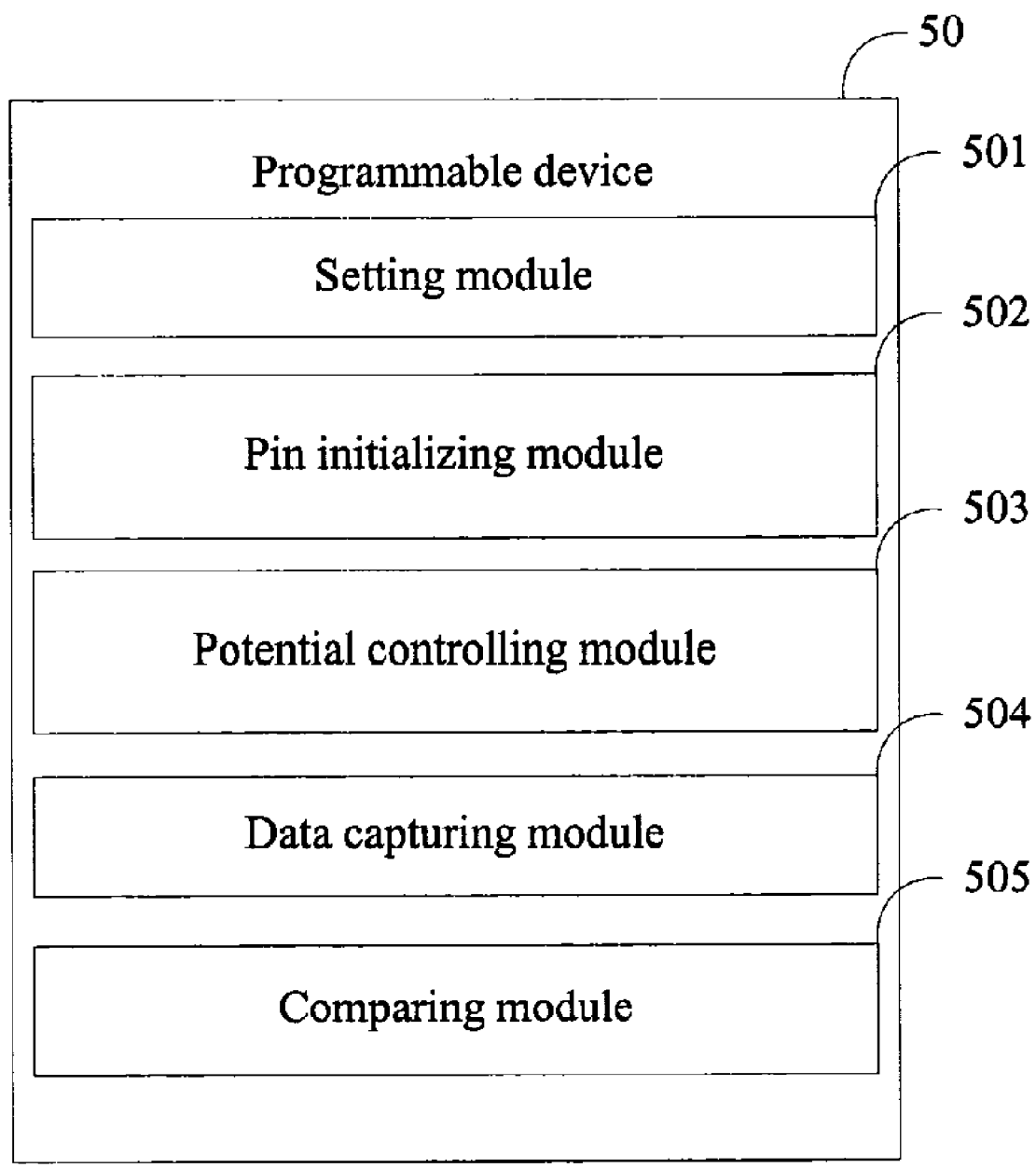
FIG. 2 is a schematic diagram showing function modules of a programmable device of the system of FIG. 1.

FIG. 2 is a schematic diagram showing function modules of the programmable device 50. The programmable device 50 includes a setting module 501, a pin initializing module 502, a potential controlling module 503, a data capturing module 504, and a comparing module 505. The setting module 501 is used for predefining ideal data before the chip 10 outputs potentials to the LED 20. The pin initializing module 502 is used for initializing the pins 101 to a potential output mode. The potential controlling module 503 is used for controlling the chip 10 to output different potentials to the LED 20. The data capturing module 504 is used for capturing data from the test fixture 30 to the parallel interface 40. The comparing module 505 is used for comparing the captured data with the ideal data, and judging whether the two data are equal. If the two data are equal, the comparing module 505 determines the LED 20 and the connector as being eligible. If the two data are not equal, the comparing module 505 determines the LED 20 and the connector as not being eligible.

The implementation of the system can be better illustrated by an example as follows. If a user tests an LED 20 and a connector thereof, the user can connect the LED 20 with the chip 10 via two pins 101. Each pin 101 can output a high potential and a low potential expressed by "1" and "0" respectively. Thus, two pins 101 can output four potentials expressed by "00", "01", "10", and "11". Because an LED needs a voltage difference to light up, the LED 20 cannot light up when the chip 10 outputs the potential "00" or "11". In contrast, the LED 20 can light up when the chip 10 outputs the potential "01" or "10". According to above-mentioned instance, the user predefines four different ideal data via the setting module 501. The ideal data "00", "01", "10", and "11" correspond to the four potentials. The pin initializing module 502 initializes the two pins 101 to a potential output mode, before the user begins to test the LED 20. Then the potential controlling module 503 controls the chip 10 to output the four potentials to the LED 20 via the two pins 101. The data capturing module 504 captures data outputted from the test fixture 30 to the parallel interface 40 after the chip 10 outputs the four potentials to the LED 20.

The comparing module 505 compares the captured data with the ideal data, and judges whether the two data are equal. If the two data are equal, the comparing module 505 determines the LED 20 and the connector as being eligible. If the two data are not equal, the comparing module 505 determines the LED 20 and the connector as being not eligible.

Figure 3:
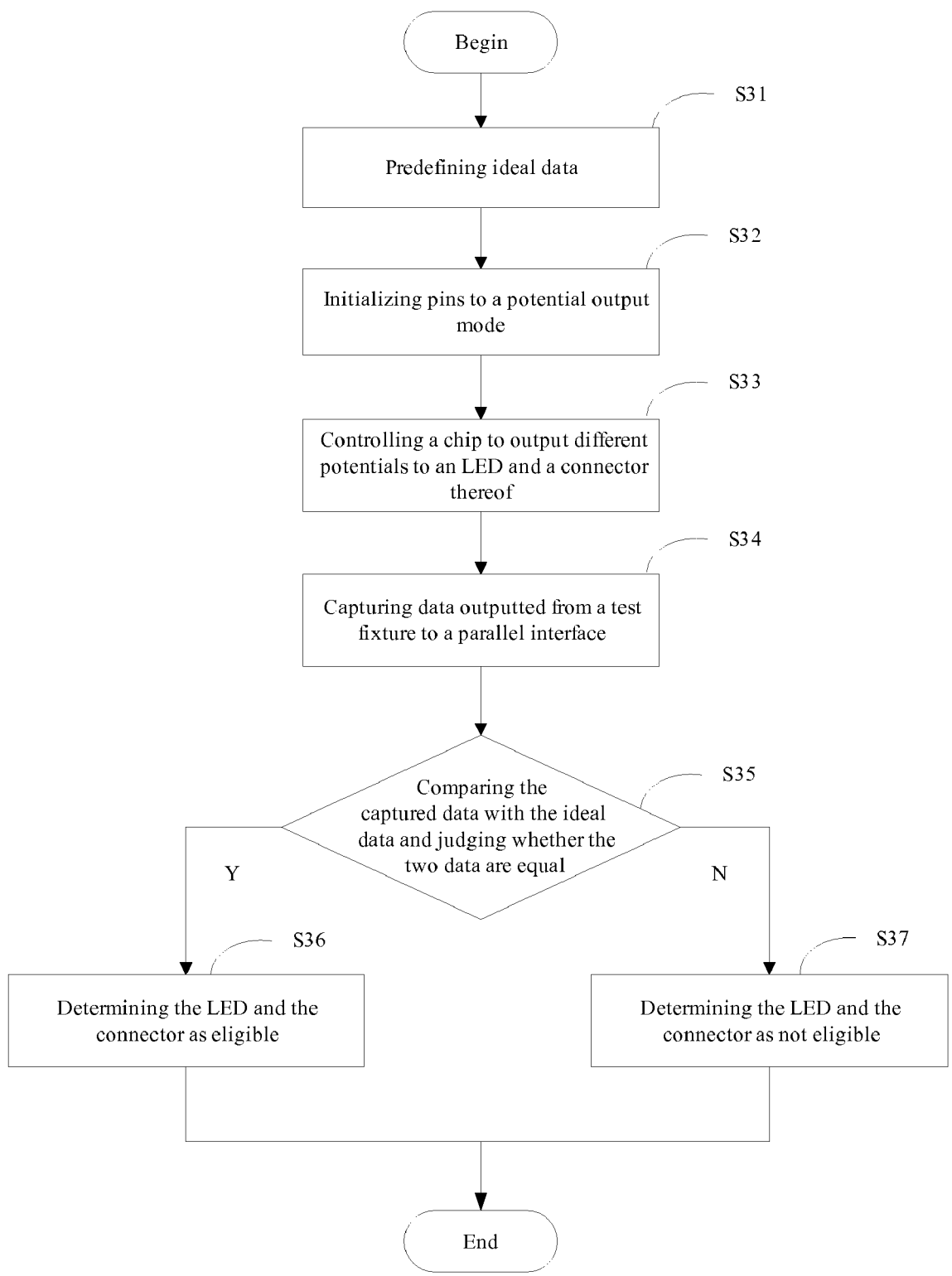
FIG. 3 is flowchart of a preferred method for testing an LED and a connector thereof by utilizing the system of FIG. 1.

FIG. 3 is a flowchart of a preferred method for testing an LED and a connector thereof by utilizing the system of FIG. 1. In step S31, a user predefines ideal data before the chip 10 outputs potentials to the LED 20. In step S32, the pin initializing module 502 initializes the pins 101 of the chip 10 connected with the LED 20 to a potential output mode. In step S33, the potential controlling module 503 controls the chip 10 to output different potentials to the LED 20. In step S34, the data capturing module 504 captures data output from the test fixture 30 to the parallel interface 40 after the chip 10 outputs the potentials to the LED 20. In step S35, the comparing module 505 compares the captured data with the ideal data, and judges whether the two data are equal. In step S36, the comparing module 505 determines the LED 20 and the connector as being eligible if the two data are equal. Otherwise, if the two data are not equal, in step S37, the comparing module 505 determines the LED 20 and the connector as being not eligible.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for testing a light emitting diode (LED) and a connector thereof, the system comprising:
    a chip having general purpose input output (GPIO) function for outputting potentials to the LED via a plurality of pins;
    a test fixture connected with the LED, for receiving data output from the LED after the chip outputs the potentials to the LED;
    a parallel interface connected with the LED through the test fixture, for receiving corresponding data output from the test fixture; and
    a programmable device connected to the chip and the parallel interface, the programmable device comprising:
    a setting module for predefining ideal data before the chip outputs the potentials to the LED;
    a pin initializing module for initializing the pins of the chip to a potential output mode;
    a potential controlling module for controlling the chip to output different potentials to the LED;
    a data capturing module for capturing the data from the test fixture to the parallel interface; and
    a comparing module for comparing the captured data with the ideal data, and judging whether the two data are equal.

2. The system according to claim 1, wherein the chip is a south bridge chipset installed in a motherboard of a computer.

3. The system according to claim 1, wherein the chip is a super I/O (Input/Output) installed in a motherboard of a computer.

4. A method for testing a light emitting diode (LED) and a connector thereof, the method comprising the steps of:
    predefining ideal data before a chip having general purpose input output (GPIO) function connected with the LED outputs potentials to the LED via a plurality of pins of the chip;
    initializing the pins of the chip to a potential output mode;
    controlling the chip to output different potentials to the LED;
    receiving data output from the LED by a test fixture connected with the LED after the chip outputs the potentials to the LED;
    capturing corresponding data output from the test fixture to a parallel interface;
    comparing the captured data with the ideal data and judging whether the two data are equal; and
    determining the LED and the connector as eligible if the two data are equal.

5. The method according to claim 4, further comprising the step of:
    determining the LED and the connector as not eligible if the two data are not equal.

* * * * *